United States Patent

Baltar et al.

[11] Patent Number: 5,517,138
[45] Date of Patent: May 14, 1996

[54] DUAL ROW SELECTION USING MULTIPLEXED TRI-LEVEL DECODER

[75] Inventors: Robert L. Baltar, Folsom; Mark E. Bauer, Cameron Park, both of Calif.

[73] Assignee: Intel Corporation, Santa Clara, Calif.

[21] Appl. No.: 316,546

[22] Filed: Sep. 30, 1994

[51] Int. Cl.[6] ............................................. H03K 19/082
[52] U.S. Cl. .......................... 326/105; 326/106; 326/10; 365/200; 365/230.06
[58] Field of Search ............................. 326/105, 106, 326/10; 365/230.02, 230.06, 200, 218

[56] References Cited

U.S. PATENT DOCUMENTS

| | | | |
|---|---|---|---|
| 3,660,819 | 5/1972 | Frohman-Bentchkowsky | 365/185 |
| 4,099,196 | 7/1978 | Simko | 365/185 |
| B14,203,158 | 9/1992 | Frohman-Bentchkosky et al. | 365/185 |
| 4,358,833 | 11/1982 | Folmsbee et al. | 365/200 |
| 4,441,170 | 4/1984 | Folmsbee et al. | 365/200 |
| 4,642,798 | 2/1987 | Rao | 365/230 |
| 5,031,142 | 7/1991 | Castro | 365/200 |
| 5,046,046 | 9/1991 | Sweha et al. | 365/200 |
| 5,088,066 | 2/1992 | Castro | 365/200 |
| 5,233,559 | 8/1993 | Brennan, Jr. | 365/200 |
| 5,237,535 | 8/1993 | Mielke et al. | 365/200 |
| 5,274,278 | 12/1993 | Bauer et al. | 307/449 |
| 5,327,383 | 7/1994 | Merchant et al. | 365/200 |
| 5,329,488 | 7/1994 | Hashimoto | 365/218 |
| 5,347,489 | 9/1994 | Merchant et al. | 365/203 |
| 5,357,470 | 10/1994 | Namekawa | 365/200 |
| 5,377,147 | 12/1994 | Merchant | 365/218 |
| 5,381,370 | 1/1995 | Lacey | 365/200 |
| 5,383,156 | 1/1995 | Komatsu | 365/200 |

*Primary Examiner*—Edward P. Westin
*Assistant Examiner*—Andrew Sanders
*Attorney, Agent, or Firm*—Blakely, Sokoloff, Taylor & Zafman

[57] ABSTRACT

A method and circuitry for providing dual row selection using a multiplexed tri-level decoder is disclosed. For one embodiment, the multiplexed tri-level decoder is a 3:8 decoder, the major components of which are a buffer and 8 three input NAND circuits. The NAND circuits are peculiar in that the inputs are referenced to a VCC operational voltage supply, and the outputs are referenced to a VPX tri-level supply voltage. The output of each NAND circuit is used to select one row or word line. During preconditioning and post conditioning, the decoder is required to enable two adjacent rows: the row selected and the next row. The present design implements dual row selection by adding a pass transistor that connects the word line enable driver to the driver of the previous row within the VPX level circuitry. This is in contrast to the previous design approach of implementing dual row selection by using VCC level logic. The disclosed implementation eliminates gates in the speed path of the circuit. This reduces the delay through the circuit. The new generation of flash memory requires reduction in read access time compared to that of previous generations. The disclosed tri-level decoder eliminates gates in the critical speed path, directly reducing read access time for the memory array.

4 Claims, 7 Drawing Sheets

FIG. 1

|  | BUS CYCLES REQUIRED | FIRST BUS CYCLE | | | SECOND BUS CYCLE | | |
|---|---|---|---|---|---|---|---|
|  |  | OPERATION | ADDRESS | DATA | OPERATION | ADDRESS | DATA |
| READ ARRAY | 1 | WRITE | X | FFH |  |  |  |
| READ STATUS REGISTER | 2 | WRITE | X | 70H | READ | X | SRD |
| CLEAR STATUS REGISTER | 1 | WRITE | X | 50H |  |  |  |
| ERASE SETUP / ERASE CONFIRM | 2 | WRITE | V | 20H | WRITE | X | D0H |
| PROGRAM SETUP / PROGRAM | 2 | WRITE | V | 40H | WRITE | PA | PD |

DUAL ROW SELECTION USING MULTIPLEXED TRI-LEVEL DECODER

FIELD OF THE INVENTION

The present invention relates to the field of nonvolatile semiconductor memories. More particularly, the present invention relates to electrically programmable read-only memories, particularly those employing floating gate devices.

BACKGROUND OF THE INVENTION

Metal-Oxide-Semiconductor (MOS) electrically programmable read-only memories (EEPROMS) frequently use memory cells that have electrically isolated gates (floating gates). These floating gates are typically completely surrounded by insulation and formed from a polychrystalline silicon (polysilicon) layer. Information is stored in the memory cells or devices in the form of the floating gates by a variety of mechanisms such as avalanche injection, channel injection, tunneling, etc., depending upon the construction of the cells. The cells are erased generally by exposing the array to ultraviolet radiation. An example of these cells can be found in U.S. Pat. Nos. 3,500,142; 3,660,819; 2,755,721; and 4,099,196. In some cases these cells are electrically erasable (EEPROM cells). An example of such a cell is shown in U.S. Pat. No. 4,203,158.

The invention of the present application is used with an EEPROM cell, particularly one which is electrically erasable, commonly referred to as a "flash" EPROM cell.

Due to the nature and design of flash EEPROM cells, the entire array must be erased in order to erase any one cell in that array. Generally, this has not been a problem in that each row (word line) is separately addressable and each column (bit line) is separately addressable or can be addressed in groups of 8 (comprising 1 byte) and that a large array can be formed from several small arrays, each of which can be erased individually. Further, prior to erasing the entire array, each memory cell in that array must be preconditioned.

Preconditioning is the process whereby a memory cell is programmed prior to erasure to avoid over-erasing the cell which can cause leakage within that cell resulting in false data readings. This occurs when a cell in the zero state undergoes an erase operation whereby it can be driven into the depletion mode. The column sense amplifier can read this current falsely as an erased cell. Therefore, proper preconditioning is necessary to avoid over erasing a single cell which can in turn cause an entire array to be defective.

When a row (word line) is found to be defective by a manufacturer (e.g., shorted to another row), it is desirable to be able to assign an alternate row to take its place. Using an alternate row can thus increase the yield of working memory chips. Due to the need to precondition each memory cell in the array, however, it is necessary to precondition each row in the array; those rows that are working as well as those rows determined to be defective in the manufacturing test stage.

An example of a method and apparatus for providing row redundancy in non-volatile semiconductor memories is shown in U.S. Pat. No. 5,233,559. The method and apparatus provides for preconditioning of each row of memory cells prior to erasing the memory array, including any rows containing defective cells as well as any redundant rows. Another example is shown in U.S. Pat. No. 5,327,383.

Similarly, post conditioning, a method for repairing over erased cells of a non-volatile memory array, must also be able to access shorted rows. An example of the use of post conditioning to repair over erased cells is shown in U.S. Pat. No. 5,237,5535.

A decoder is used to access rows. During preconditioning and post conditioning, this decoder is required to enable two adjacent rows: the row selected and the next row. The previous decoder design implements dual row selection by using device power supply, VCC, voltage level logic (see FIG. 4). This circuit is too slow to accommodate the read access rate desired for new, faster, flash memories.

SUMMARY OF THE INVENTION

An object of the present invention is to provide fast row selection while also providing dual row selection within a memory array having redundant rows.

Another object of the present invention is to provide dual row selection within a memory array having redundant rows wherein the row selection is referenced to a multi-level power supply voltage.

Another object of the present invention is to provide dual row selection within a memory array during preconditioning of the memory array.

Another object of the present invention is to provide dual row selection within a memory array during post conditioning of the memory array.

A method and circuitry for providing dual row selection using a multiplexed tri-level decoder is disclosed. For one embodiment, the multiplexed tri-level decoder is a 3:8 decoder, the major components of which are a buffer and 8 three input NAND circuits. The NAND circuits are peculiar in that the inputs are referenced to a VCC operational voltage supply, and the outputs are referenced to a VPX tri-level supply voltage. The output of the NAND circuit is used to select one row or word line.

During preconditioning and post conditioning, the decoder is required to enable two adjacent rows: the row selected and the next row. The present design implements dual row selection by adding a pass transistor that connects the word line enable driver to the driver of the previous row within the VPX level circuitry.

This is in contrast to the previous design approach of implementing dual row selection by using VCC level logic. The disclosed implementation eliminates gates in the speed path of the circuit. This reduces the delay through the circuit. The new generation of flash memory requires reduction in read access time compared to that of previous generations. The disclosed tri-level decoder eliminates gates in the critical speed path, directly reducing read access time for the memory array.

Other objects, features, and advantages of the present invention will be apparent from the accompanying drawings and from the detailed description that follows. dr

BRIEF DESCRIPTION OF THE FIGURES

The present invention is illustrated by way of example and not limitation in the figures of the accompanying drawings in which references indicate similar elements and in which.

DETAILED DESCRIPTION

Figure 1:
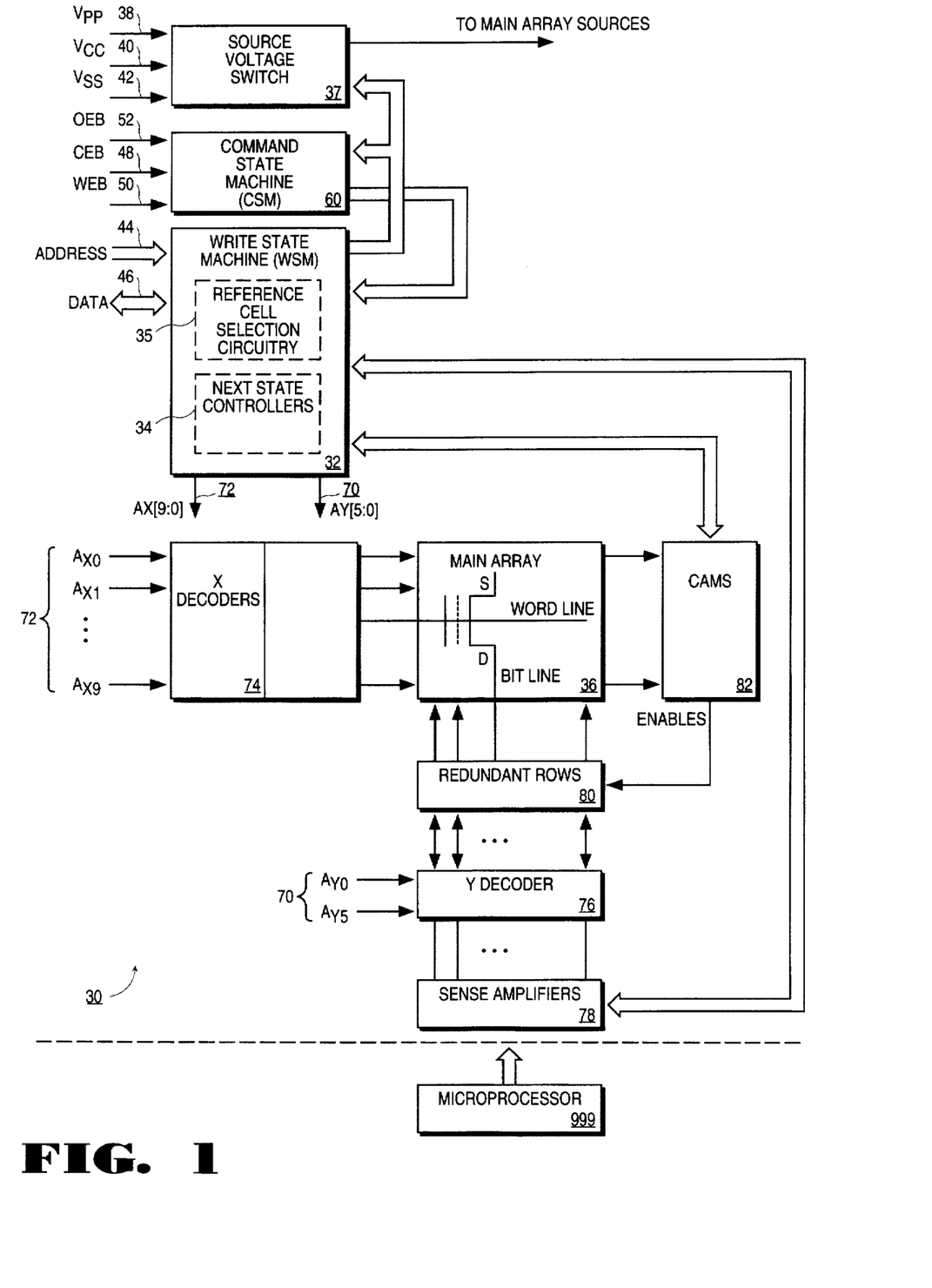
FIG. 1 is a block diagram of a flash memory.

FIG. 1 illustrates in block diagram form the circuitry of flash EEPROM 30, which is also referred to as flash memory 30.

Flash memory 30 includes a next state controller 34 within write state machine 32. Next state controller 34 includes five controllers. One controller, the precondition controller, manages the preconditioning of memory array 36 prior to erasure. The precondition controller preconditions memory array 36, preventing shorted rows from leaking current onto bit lines during erase verification. The precondition controller does so by preconditioning shorted cells to a lower threshold voltage level than good cells. Alternately, the function of WSM 32 is performed by a programmable microcontroller.

Flash memory 30 includes reference cell selection circuitry 35 within write state machine 32. Reference cell selection circuitry 35 allows the precondition controller to verify the preconditioning of memory array 36. Reference cell selection circuitry 35 includes a special reference cell that allows shorted cells to be preconditioned to voltage levels lower than the normal precondition level but sufficient to help prevent shorted rows from being over-erased.

In this application, signals will be generally referred to by signal names. Particular signal names may be varied without departure from the scope and spirit of the present invention. Further, signal states will be referred to as being active or inactive, high or low, one or zero, true or false, etc.. Signals which are active when low are indicated by a suffix of "B"; i.e. XXXB. As examples of these signal naming conventions, see Table 1 below:

TABLE 1

| SIGNAL NAMES | ELECTRICAL NOTATION | LOGICAL NOTATION | STATE |
| --- | --- | --- | --- |
| READY | High | 1 or true | Active |
|  | Low | 0 or false | Inactive |
| RESETB | Low | 1 or true | Active |
|  | High | 0 or false | Inactive |

In describing groups of signals a decimal radix convention will be used, such as using AY(5:0) to refer to all 6 signals of a group. Within each group, the least significant bit of the group is referred to with a suffix of "0." In other words, AY0 refers to the least significant bit of the group and AY5 refers to the most significant bit.

Referring again to FIG. 1, VPP 38 is the erase/program power supply voltage for flash memory 30. VCC 40 is the device power supply for flash memory 30 and VSS 42 is ground. For one embodiment, VPP 38 is 12.0 volts and VCC 40 is approximately 5 volts.

In the absence of high voltage on VPP 38, flash memory 30 acts as a read-only memory. The data stored at an address supplied via lines 44 is read from memory array 36 and made available via data input/output lines 46 to the circuitry external to the flash memory 30, such as microprocessor 999.

Flash memory 30 has three control signals: chip-enable bar CEB 48, WEB 50, and output-enable bar OEB 52. CEB 48 is the power control and is used to select flash memory 30. CEB 48 is active low. OEB 52 is the output control signal and is used to gate data from the data pins 46 from flash memory 30. OEB 52 is active low. Both control signals, CEB 48 and OEB 52, must be logically active to obtain data on data lines 46 of flash memory 30.

The write enable bar signal, WEB 50, allows writes to command state machine 60 while CEB 48 and write enable bar signal 50 are logic 0s. Addresses and data are latched on the rising edge of WEB 50. Standard microprocessor timings are used.

Figure 2:
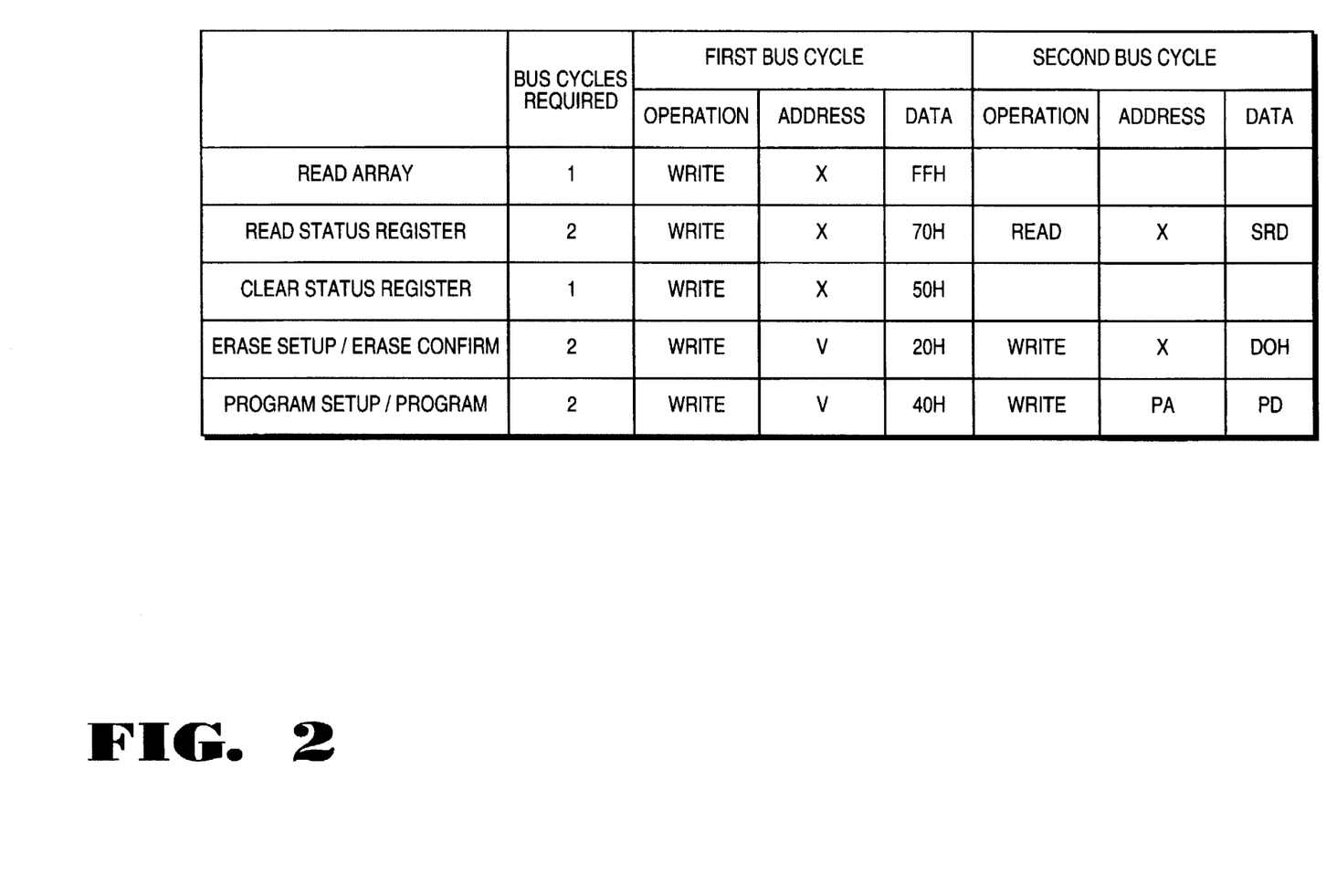
FIG. 2 is a table of flash memory commands.

Commands to program or erase memory array 36 are applied via data lines 46. The data on lines 46 is passed on to command state machine ("CSM") 60. CSM 60 decodes the data and if it represents an erase, program or status register reset command, CSM 60 begins generating appropriate control signals for write state machine 32. FIG. 2 defines certain commands.

SRD in FIG. 2 represents data read from a status register within write state machine 32. PA in FIG. 2 represents the address of the memory location to be programmed and PD represents the data to be programmed at address PA.

Erase is executed on all of array 36 at once and is initiated by a two-cycle command sequence. An erase-setup command is first written, followed by the erase-confirm command. Array preconditioning, erase and erase verification are all handled internally by write state machine 32, invisible to the microprocessor 999.

This two step erase, set-up followed by execution, ensures that memory contents are not accidentally erased. Erasure can occur only when high voltage is applied to VPP 38. In the absence of this high voltage, the memory array contents are protected against erasure.

The erase event involves three major tasks: preconditioning, erasure and post-erase repair, if desired. Preconditioning array 36 brings cell threshold voltages to a minimum level of approximately 5 volts and prolongs the longevity of the array 36 by preventing cell threshold voltages from dropping to levels during erasure that could result in cell leakage. Erasing brings cell voltages to levels below approximately 3.25 volts, a logic 1. Post-erase repair, also referred to as post conditioning, repairs over erased cells by bringing threshold voltages below zero volts up to approximately 1 or 2 volts.

Microprocessor 999 can detect the completion of an erase event by issuing a Read Status Register command and analyzing the status data. When the status register indicates that the erase event is over, the erase failure status bit should be checked. After examination, the status register error bits should be cleared as appropriate.

Programming is also executed by a two-cycle command sequence. The Program Set-up command is written to command state machine 60 via data lines 46, followed by a second write command specifying the address and data to be programmed. Write state machine 32 then takes over, controlling the program and verify algorithms internally. Polling the status register with the Status Register Read command will determine when the programming sequence is complete. Only the Read Status Register command is valid while programming is active.

When the status register indicates that the programming event is over, the program fail bit should be checked. After examination, the microprocessor 999 should clear the status register error bits as appropriate.

For one embodiment, the circuitry of flash memory 30 shown in FIG. 1 resides on a single substrate. Flash memory 20 employs CMOS circuitry, for one embodiment.

Flash memory 30 includes memory array 36, which uses memory cells to store data. Shorted rows within memory array 36 can be replaced by redundant rows 80. In addition, flash memory 20 includes on-chip command state machine 60, a synchronizer, write state machine ("WSM") 32 and a status register.

The program and erase algorithms are regulated by write state machine 32. Write state machine 32 latches in the necessary address and data needed to complete erase and program operations from address lines 44 and data lines 46.

The write state machine 32 interfaces with memory array 36 via array address signals AY(5:0) 70 and AX(9:0) 72 and sense amp outputs SOUT (15:0) 228, which represent the data stored at the addressed memory location.

X decoder 74 selects the appropriate row within array 36 in response to AX(9:0) 72. For this reason, X decoder 74 is also called row decoder 47. Similarly, in response to AY(5:0) 70 Y decoder 76 selects the appropriate columns in array 36. Y decoder 76 is also called column decoder 76.

Data read from array 36 is output to Y decoder 76, which passes the data to sense amplifiers 78. Sense amplifiers 78 determine whether the threshold voltages of array cells exceed a reference level. Sense amplifiers 78 pass their information, SOUT (15:0), to write state machine 32.

Content addressable memories, CAMS 82,, enable redundant rows 80 when appropriate. Each CAM stores the address of a defective row within array 36. Each CAM 82 compares the address it stores to address signals 70 and 72. When a match occurs, a redundant row is activated. CAMS 82 also inform write state machine 32 of the addressing of a shorted row via a signal, TWOROW 236.

Figure 3:
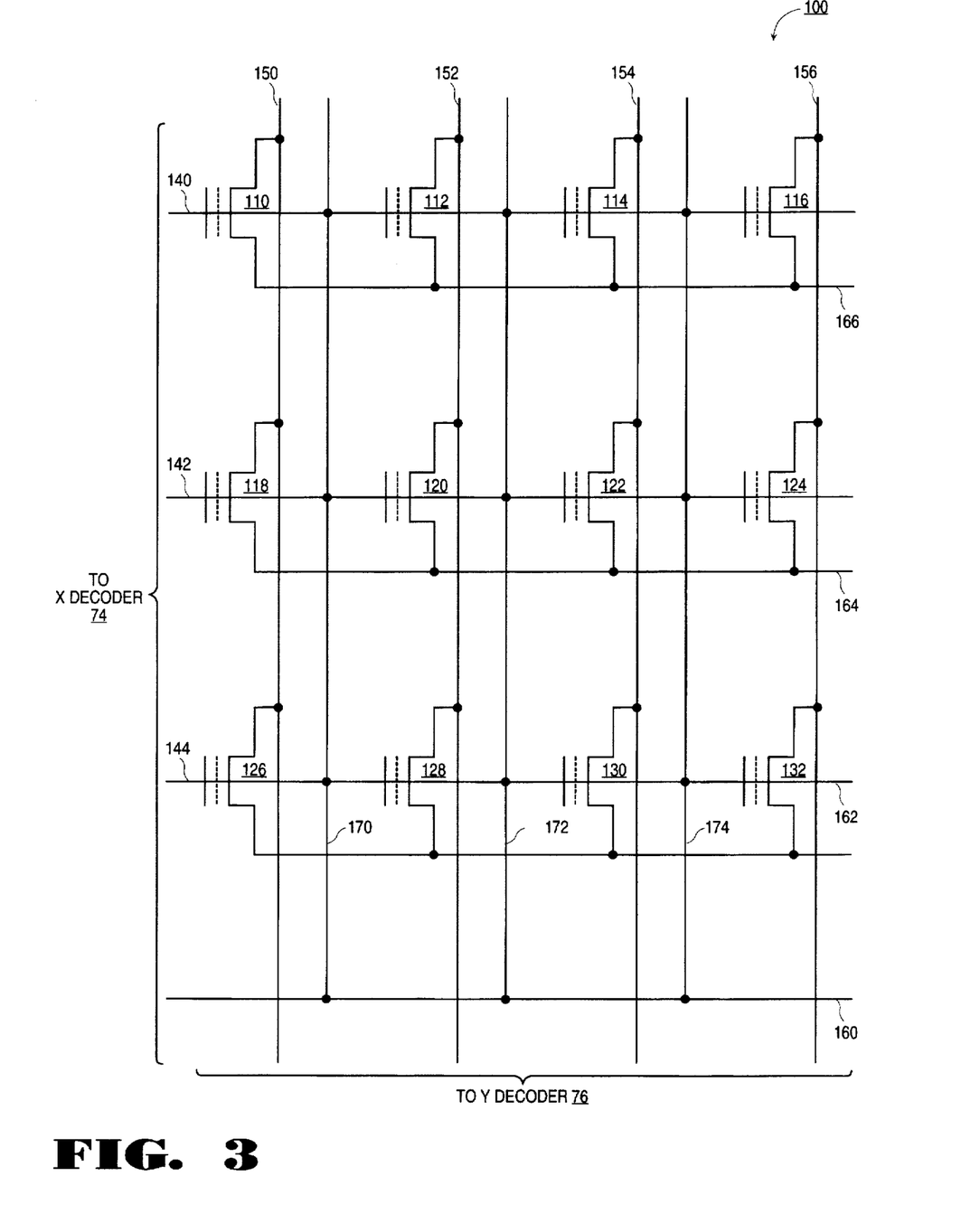
FIG. 3 is a schematic of a portion of a memory array.

FIG. 3 illustrates a portion 100 of memory array 36. Portion 100 includes several memory cells 110–132, each of which is a field effect transistor. Cells 110–132 are formed at the intersections of word lines 140–146 and bit lines 150–156, as is the common practice.

Each of word lines 140–146 is coupled to the gates of memory cells in one row. For example, word line 142 is coupled to the gates of memory cells 118–124.

Each of the bit lines 150–156 is coupled a column of memory cells. For example, bit line 152 is coupled to the drains of memory cells 112, 120 and 128. Bit lines 150–156 are also coupled to Y decoder 76.

Common source line 160 is coupled to source switch 37, which regulates the voltage levels applied to the sources of array memory cells 110–132. Common source line 160 is also coupled to first local source lines 162–166 and second local source lines 170–174. Each first local source line 162–166 is coupled to a particular row of array 36. Similarly, each second local source line 170–174 is coupled to a particular column. Together, source lines 162–166, 170–174, and 160 provide a path for applying voltages to the sources of cells 110–132.

For one embodiment, memory cells 110–132 are programmed, preconditioned, and post conditioned by applying a potential of approximately 12 volts to word lines 140–144, a potential of approximately 7 volts to bit lines 150–156, and tying common source line 160 to ground. Properly programmed and preconditioned memory cells have a threshold voltage of approximately 5 volts.

Memory cells 110–132 are erased by applying a potential of approximately 12 volts to common source line 160, grounding word lines 140–144, and allowing bit lines 150–156 to float. Properly erased memory cells have a positive threshold voltage somewhere between 0 volts and 3 volts.

Erasure programming, preconditioning and post conditioning of array 36 are all accomplished using algorithms controlled by next state controller 34. These algorithms repeatedly apply the appropriate pulses to array 36 until the slowest responding cell array 90 reaches an acceptable threshold voltage.

Figure 4:
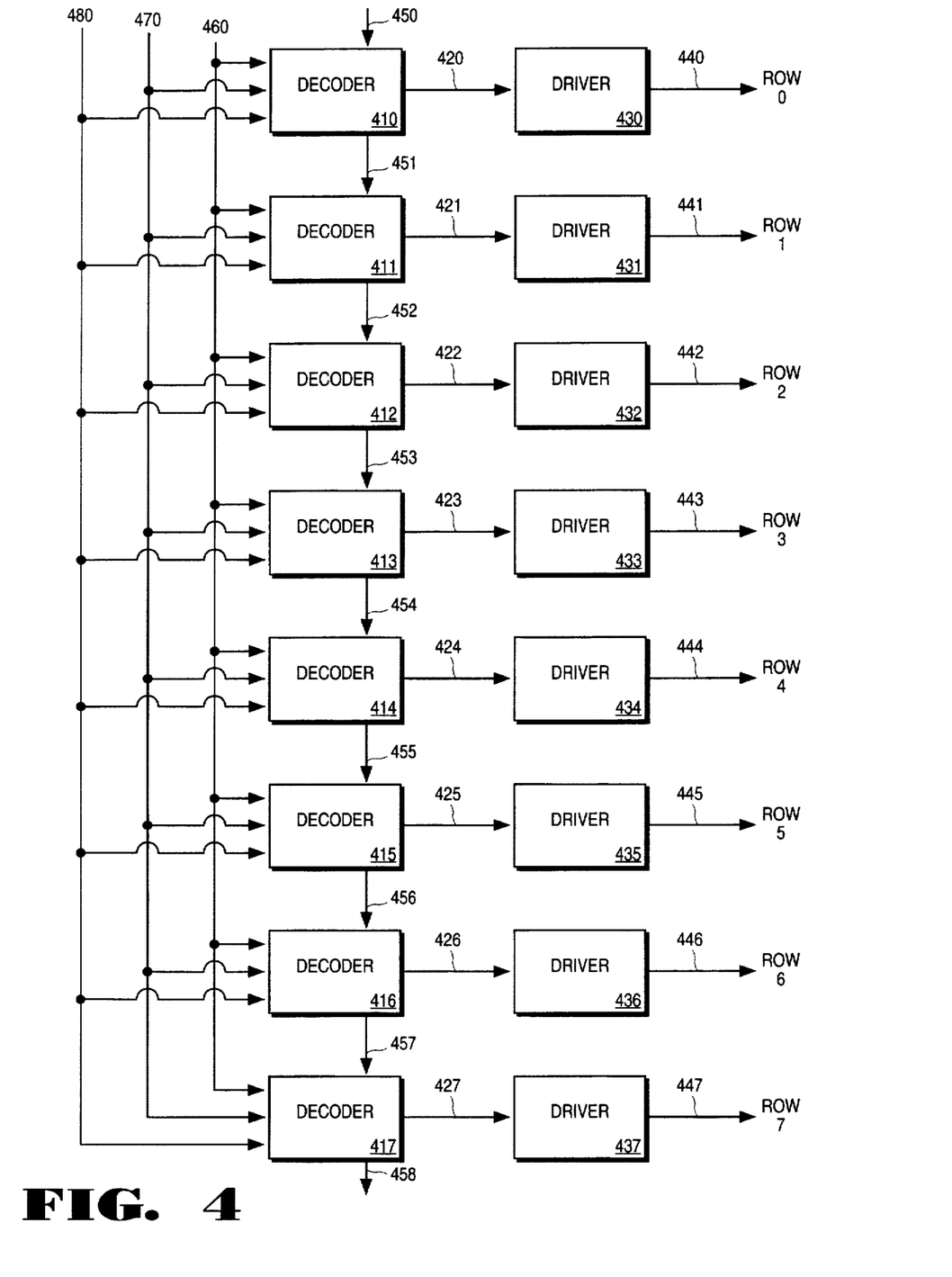
FIG. 4 is a block diagram illustrating a set of tri-level decoders that permit dual row selection for pairs of rows.

FIG. 4 is a block diagram illustrating a set of tri-level decoders that permit dual row selection for pairs of rows. In FIG. 4, rows 0 through 7 together form an eight row block of rows that is selected by enable signal 470. Enable signal 470 can be thought of as a select signal that indicates when one of the rows of the eight row block has been specified to be accessed. Local decoders 0 through 7 (410 through 417) correspond to rows 0 through 7, respectively, and enable signal 470 is provided to each local decoder. Address signal 480 is also provided to local decoders 410 through 417. For this example, address signal 480 is a three-bit signal that specifies which row of the eight row block is to be accessed when enable signal 470 specifies that one row of the eight row block is to be accessed. Alternate word line block sizes can be employed. For example, if there were sixteen word lines within a block, then address signal 380 would be a four-bit signal, or, if there were only four word lines within a block, then address signal 380 only need be a two-bit signal. Each decoder 410 through 417 has a corresponding row driver circuit 430 through 437, respectively, used to drive the row corresponding to the decoder.

Consider the normal case, wherein none of the rows in the eight row block are shorted together. When one of the rows within the block is to be accessed during a read or program operation, enable signal 470 will specify that the block is to be accessed and address signal 480 will specify which of the rows within the block is to be accessed. The decoder corresponding to the row to be accessed will detect that the row is to be accessed and enable the row driver for that row. For example, if row 3 is to be accessed, then enable signal 470 will specify that one of the rows within the block is to be accessed and address signal 480 will specify that it is row 3 that is to be accessed. Although each of the decoders 410 through 417 will receive this information, only decoder 413 will act. Because decoder 413 corresponds to row 3, decoder 413 will enable driver 433 so that row 3 can be accessed.

Now consider the case wherein two of the rows in the eight row block are shorted together. When one of the shorted rows within the block is to be accessed during a read or program operation, corresponding redundant rows (not shown) will be accessed instead. Thus, enable signal 470 will not specify that the block is to be accessed.

On the other hand, during the preconditioning or post conditioning operations, the shorted rows will have to be accessed. Signal TWOROW 460 is provided to each decoder 410 through 417 to indicate when the row specified to be accessed by address 480 is one row of a pair of rows that are shorted together. Each decoder also has an output (451 through 458, respectively) to signify to the decoder of the next row that the next row is the second row of a shorted two row pair.

For example, if row 3 is shorted to row 4, and rows 3 and 4 are to be accessed, say for preconditioning, then: enable signal 470 will specify that one of the rows within the block is to be accessed; address signal 480 will specify that it is row 3 that is to be accessed; and signal TWOROW 460 will specify that a pair of rows are to be accessed. Although each of the decoders 410 through 417 will receive this information, only decoder 413 and decoder 414 will act. Because decoder 413 corresponds to row 3, decoder 413 will enable driver 433 so that row 3 can be accessed. Also, because signal TWO ROW 460 is indicating that a pair of rows are to be accessed, decoder 413 will use signal 454 to signal decoder 414 that row 4 is to be accessed. Thus, even though row 4 was not specified by address 480, decoder 414 will activate row driver 434 for row 4. Therefore, both rows 3 and 4 will be accessed to permit them to be preconditioned.

Note that in FIG. 4, row 7 decoder 417 is shown to have an output 458 to signify to the next block of rows during preconditioning or post conditioning that the first row of the next block is to be accessed along with row 7 when these two rows are shorted together. Also note that row 0 decoder 410 has a similar input 450 from the row decoder of the last row of the previous block of rows. Signals 450 and 458 are used within an embodiment wherein redundancy can be used to replace a pair of rows that are shorted together when each row belongs to a different local block of rows. Alternately redundancy can only be provided for shorted pairs of rows when each of the shorted rows belong to the same local block of rows. In the latter case, signals 450 and 458 would not be provided. Furthermore, in the alternate case, TWOROW signal 460 is not provided to row decoder 417 corresponding to row 7 (i.e., the last row within the local block of rows).

Figure 5:
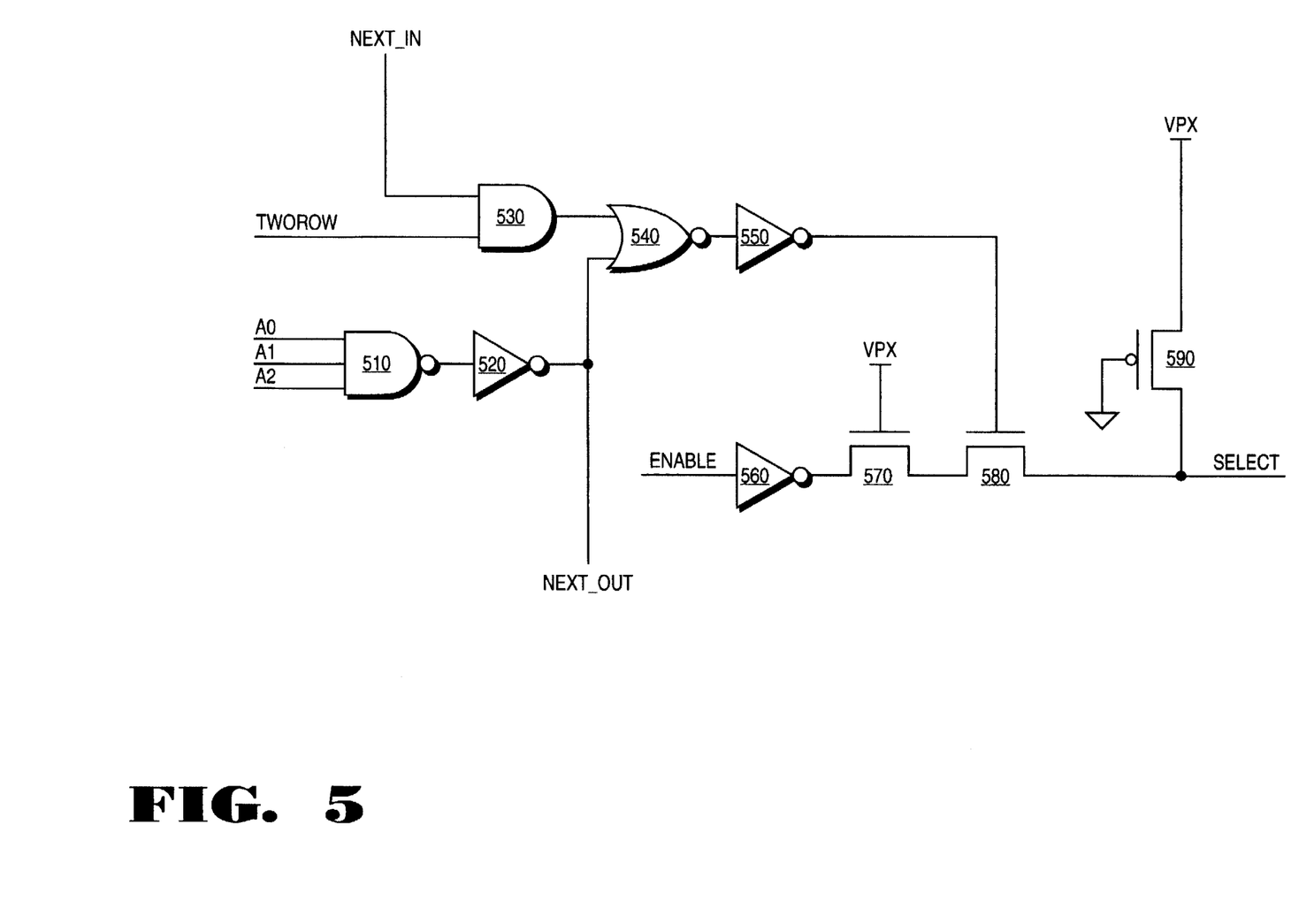
FIG. 5 is a circuit diagram illustrating a tri-level decoder that permits dual row selection using VCC level logic.

FIG. 5 is a circuit diagram illustrating a tri-level decoder that permits dual row selection using VCC level logic. For example, if the circuit of FIG. 5 corresponds to row 3 decoder 413 of FIG. 4, then signals NEXT__IN and NEXT__OUT of FIG. 5 will correspond to FIG. 4 signals 453 and 454, respectively. Similarly, signals TWOROW, ENABLE, and SELECT of FIG. 5 will correspond to FIG. 4 signals 460, 470 and 423, respectively. Signals A0, A1 and A2 of FIG. 5 would together correspond to address signal 480 of FIG. 4 and would represent the three-bit address for row 3.

NAND gate 510 and inverter 520 together generate signal NEXT_OUT when the address for the decoder is asserted on signals A(2:0). AND gate 530 and NOR gate 540 together combine signals NEXT__IN, TWOROW and NEXT__OUT to provide an access signal that controls pass transistor 580. Signal ENABLE is inverted by inverter 560 and input to pass transistor 570. Then, if the block for this row is to be accessed (i.e., signal ENABLE is asserted), pass transistor 580 will permit signal SELECT to be pulled down to VSS. This will override pull up transistor 590 and thereby activate the row driver for the row corresponding to the decoder of FIG. 5.

Note that VPX is a variable voltage power supply wherein the voltage provided is dependent upon the operation being performed during the access. Thus, for one embodiment, VPX will have the value of 5 volts if a read operation is being performed, 12 volts if a program operation is being performed, 7 volts if preconditioning is being performed and 4 to 7 volts if post conditioning is being performed. Signal SELECT is a low true signal. Therefore, when the selected wordline is enabled to ground, the deselected rows of selected blocks are pulled to VPX.

Also note that the dual row selection function is integrally part of the decoding critical path and is performed by VCC level circuitry. Thus, provided ENABLE is asserted, signal SELECT will be asserted if address A(2:0) corresponds to the row for this decoder, or if signals NEXT__IN and TWOROW are asserted.

Figure 6:
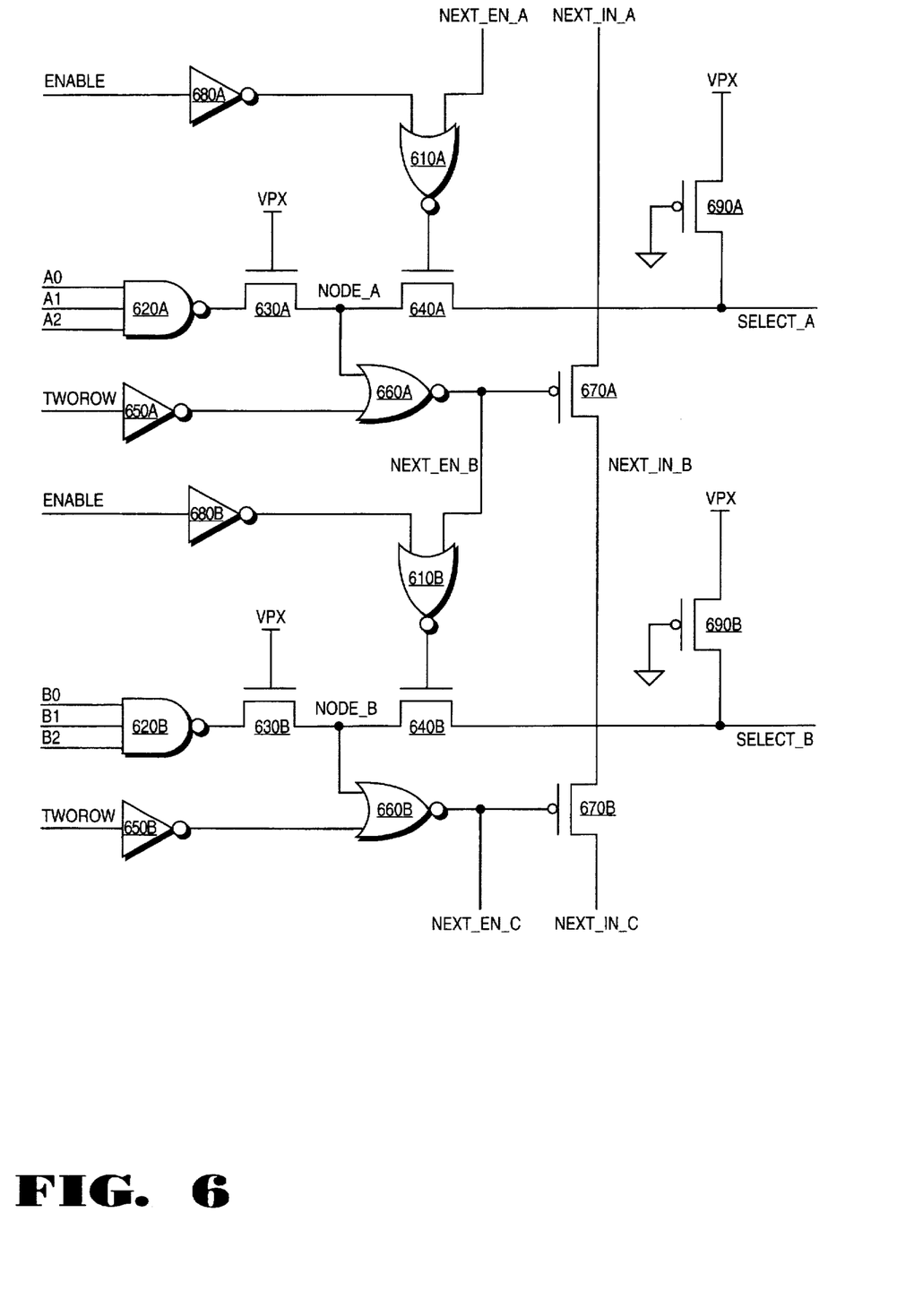
FIG. 6 is a circuit diagram illustrating a pair of fast tri-level decoders that permit dual row selection by adding a pass transistor that connects the word line enable driver to the driver of the previous row in the VPX level circuitry.

Therefore, it can be seen that FIG. 5 presents an embodiment of a dual row multiplexer that includes a row recognizer, a dual row detector, shorting circuitry and isolation circuitry. Consider the case where first through third rows correspond to rows B, A and C respectfully. In FIG. 6, NAND 620B operates as a row recognizer that has been adapted to decode an address (B2:0) and, if the address corresponds to the first row (row B), the recognizer provides as output a row select signal (SELECT_B) for the first row. Inverter 650A, NOR 660A, NOR 610B, Inverter 650B, and NOR 660B together form a dual row detector having as input a two row required signal (TWO ROW). The two row required signal (TWO ROW) is specified when the first row (row B) is to be addressed as part of a first row pair including the first row (row B) and the second row (row A). The two row signal is also specified when the first row (row B) is to be addressed as part of a second row pair including the first row (row B) and a third row (row C). If the two row required signal is specified and the row select signal is output from the recognizer, the dual row detector provides as output a dual row detected signal. Transistor 670A, in turn, operates as shorting circuitry adapted to shorting the first row (row B) to the second row (row A) if the dual row detected signal is provided as output from the dual row detector. Transistor 640B operates as isolation circuitry adapted to isolating the row recognizer from the first row (row B) if the third row (row C) is addressed and dual row addressing is specified for the third row (row C). Furthermore, in this example, 690B acts as a variable voltage pull up device to pull the row select signal (SELECT_B) to at least two different voltages.

FIG. 6 is a circuit diagram illustrating a pair of fast tri-level decoders that permit dual row selection by adding a pass transistor that connects the word line enable driver to the driver of the previous row in the VPX level circuitry. For example, if the circuit of FIG. 6 corresponds to row 3 and 4 decoders 413 and 414 of FIG. 4, then signals NEXT__IN__A and NEXT__EN__A of FIG. 6 together will correspond to FIG. 4 signal 453; signals NEXT__IN__B and NEXT__EN__B of FIG. 6 together will correspond to FIG. 4 signal 454; and signals NEXT__IN__C and NEXT__EN__C of FIG. 6 together will correspond to FIG. 4 signal 455. Similarly, signals TWOROW and ENABLE of FIG. 6 will correspond to FIG. 4 signals 460 and 470, respectively. Signals SELECT_A and SELECT__B of FIG. 6 will correspond to FIG. 4 signals 423 and 424, respectively. Signals A0, A1 and A2 of FIG. 6 would together correspond to address signal 480 of FIG. 4 and would represent the three-bit address for row 3 (row A). Also, signals B0, B1 and B2 of FIG. 6 would together correspond to address signal 480 of FIG. 4 and would represent the three-bit address for row 4 (row B).

During preconditioning and post conditioning, the decoder is required to enable two adjacent rows: the row selected and the next row. The circuit of FIG. 6 implements dual row selection by adding a pass transistor that connects the word line enable driver to the driver of the next row in the VPX level circuitry. Compared to the circuit of FIG. 5, the FIG. 6 dual row selection decoder implementation eliminates two gates in the speed path of the circuit. This reduces the delay through the circuit.

Control signal TWOROW is used to enable dual row selection. If TWOROW is high and word line A is selected (SELECT__A is low), the output of NOR 660A is high (VCC). This forces the output of NOR 610B low and the gate of 640B is forced low, disabling the input to word line B (SELEC_B). NOR 660A also forces the gate of transistor 670A high (VCC) connecting the word line select paths for the two rows.

Thus, during a single row access of row A, signal A(2:0) will cause the output of NAND 620A to be pulled down to VSS, thereby overriding pull up transistor 690A. This is because signal ENABLE, inverted by inverter 680A, and then input to NOR 610A, will cause the output of NOR 610A to close pass transistor 640A and row A will be selected (SELECT_A).

If a dual row selection of rows A and B is being requested, signal TWOROW (inverted by inverter 650A) and the output of pass transistor 630A (NODE_A) will cause the output of NOR 660A (signal NEXT_EN_B) to close gate 670A thereby shorting together the select signals for rows A and B. To avoid a short from SELECT_B back through NAND 620B, signal NEXT_EN_B is input to NOR 610B and will cause pass gate 640B to open and isolate SELECT_B from NAND 620B.

For an alternate embodiment, inverters 680A and 680B can be eliminated if signal ENABLE is replaced with active low signal ENABLEB. Furthermore, inverters 650A and 650B can be similarly eliminated if signal TWO ROW is replaced with active low signal TWOROWB.

Figure 7:
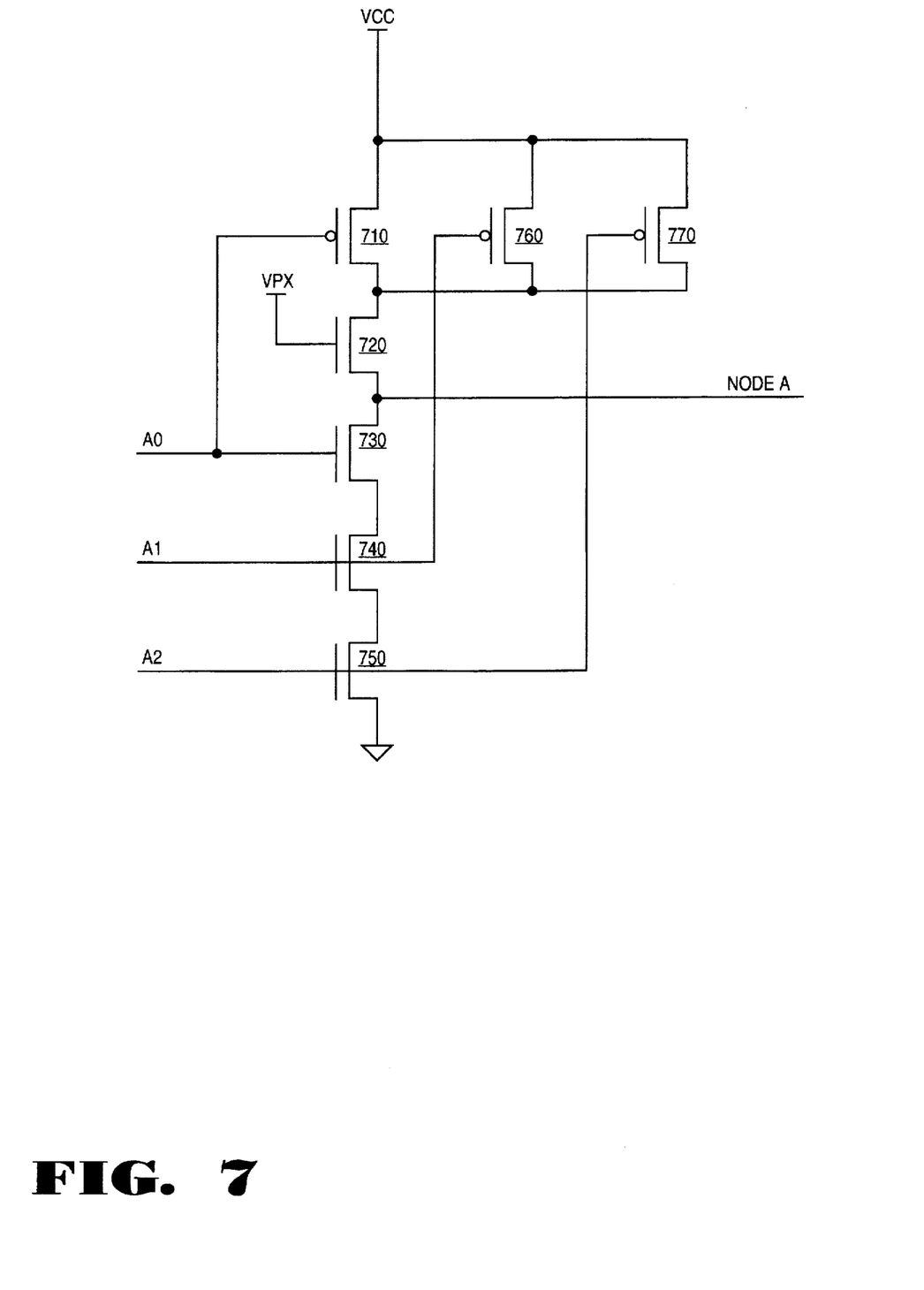
FIG. 7 is a circuit diagram illustrating the integration of pass gate 630A of FIG. 6 into NAND gate 620A of FIG. 6.

Moreover, pass gate 630A and NAND gate 620A are shown in FIG. 6 as separate elements in order to simplify the presentation of the circuit. FIG. 7 is a circuit diagram illustrating the integration of pass gate 630A of FIG. 6 into NAND gate 620A of FIG. 6. Thus, in FIG. 7, gate 720 performs the function of gate 630A of FIG. 6, thereby removing yet another gate from the critical row select path of ROW A. Of course, in a similar manner, pass gate 630B of FIG. 6 can be integrated into NAND gate 620B of FIG. 6.

Thus, a method and circuitry for providing dual row selection of shorted rows of a memory array during preconditioning and post conditioning has been described. The tri-level decoder described eliminates gates in the critical speed path, directly reducing read access time.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A dual row multiplexer, comprising:

a row recognizer adapted to decode an address, if said address corresponds to a first row, said recognizer providing as output a row select signal for said first row;

a dual row detector having as input a two row required signal, said two row required signal being specified when said first row is to be addressed as part of a first row pair including said first row and a second row and also specified when said first row is to be addressed as part of a second row pair including said first row and a third row, if said two row required signal is specified and said row select signal is output from said recognizer, said dual row detector providing as output a dual row detected signal;

shorting circuitry adapted to shorting said first row to said second row if said dual row detected signal is provided as output from said dual row detector; and isolation circuitry adapted to isolating said row recognizer from said first row if said third row is addressed and dual row addressing is specified for said third row.

2. The multiplexer as set forth in claim 1 wherein said multiplexer further comprises a variable voltage pull up device to pull said row select signal to at least two different voltages.

3. A dual row multiplexing method, comprising the steps of:

decoding an address within a row recognizer circuit, if said address corresponds to a first row, providing as output a row select signal for said first row;

receiving as input a two row required signal, said two row required signal being specified when said first row is to be addressed as part of a first row pair including said first row and a second row and also being specified when said first row is to be addressed as part of a second row pair including said first row and a third row, and if said row select signal is also received as input, providing a dual row detected signal;

shorting said first row to said second row if said dual row detected signal is provided; and isolating said row recognizer circuit from said first row if said third row is addressed and dual row addressing is specified for said third row.

4. The multiplexing method as set forth in claim 3 further comprising the steps of:

pulling said row select signal to a first voltage; and pulling said row select signal to a second voltage.

* * * * *

UNITED STATES PATENT AND TRADEMARK OFFICE
CERTIFICATE OF CORRECTION

PATENT NO.   :   5,517,138
DATED        :   May 14, 1996
INVENTOR(S)  :   Baltar et al.

It is certified that error appears in the above-identified patent and that said Letters Patent is hereby corrected as shown below:

In column 2, at line 57, delete "dr".

In column 9, at line 1, delete "SELEC_B" and substitute --SELECT_B--.

Signed and Sealed this

Tenth Day of December, 199

Attest:

BRUCE LEHMAN

Attesting Officer     Commissioner of Patents and Trademarks